United States Patent
Nakamura et al.

(10) Patent No.: US 6,625,778 B1
(45) Date of Patent: Sep. 23, 2003

(54) TURBO ERROR-CORRECTING DECODER AND TURBO ERROR-CORRECTING DECODING METHOD

(75) Inventors: Takahiko Nakamura, Tokyo (JP); Hachiro Fujita, Tokyo (JP); Hideo Yoshida, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 320 days.

(21) Appl. No.: 09/654,067

(22) Filed: Sep. 1, 2000

(30) Foreign Application Priority Data

Sep. 6, 1999 (JP) ........................................... 11-251071

(51) Int. Cl.[7] ............................................ H03M 13/00

(52) U.S. Cl. ........................................ 714/786; 714/780

(58) Field of Search ................................ 714/755, 786; 375/341

(56) References Cited

U.S. PATENT DOCUMENTS 6,421,804 B1 * 7/2002 Lee ............................. 714/755
6,487,693 B1 * 11/2002 Kim et al. ................... 714/786
6,499,128 B1 * 12/2002 Gerlach et al. .............. 714/755

FOREIGN PATENT DOCUMENTS

CA  EP 0897224 A2 * 2/1999 ............ H03M/13/00
KR  WO 99/55008     * 10/1999 ............ H03M/13/00

OTHER PUBLICATIONS

Wang et al., Iterative (Turbo) soft interference cancellation and decoding for coded CDMA, Jul. 1999, IEEE Trans. on Communication, vol. 47, No. 7, pg. 1046–1061.*
Jeong et al., Optimal quantization for soft–Decision Turbo Decoder, IEEE, 1999, pg. 1620–1624.*
Alajaji et al., Soft–decision COVQ for rayleigh–fading channels, IEEE communications letters, vol. 2, No. 6, Jun. 1998, pg. 162–164.*
Ho, Kean–po, Soft decoding vector quantizer using reliability information from turbo codes, IEEE communications letters, vol. 3 No. 7, Jul. 1999.*
Lee et al, "IEICE Trans. Communication", Vo. 81–B, No. 12, pp. 2514–2519 (Dec. 1998).

* cited by examiner

Primary Examiner—Albert Decady
Assistant Examiner—Shelly A Chase
(74) Attorney, Agent, or Firm—Birch, Stewart, Kolasch & Birch, LLP (57) ABSTRACT

In a conventional turbo error-correcting decoder, the soft-decision information is corrected by using an average value (A) and a variance value ($\sigma^2$) of reliability of received bits. From the reliability-corrected soft-decision information, the hard-decision information is obtained. This process of calculation is complex, giving rise to a problem of reduced processing speed and complicated circuit. To deal with this problem, an average value of reliability of received information bits is determined and then a ratio between the average value and the soft-decision information is also determined. This ratio is converted by the conversion table into the reliability-corrected soft-decision information, from which the hard-decision information is obtained.

10 Claims, 11 Drawing Sheets

TURBO ERROR-CORRECTING DECODER AND TURBO ERROR-CORRECTING DECODING METHOD

BACKGROUND OF THE INVENTION

1. Field of the Invention

The present invention relates to a turbo error-correcting decoding method and apparatus in a communications field, such as radio communications apparatus, and more particularly to a turbo error-correcting decoding method and apparatus capable of performing calculation on soft-decision information at high speed.

2. Description of the Related Art

Figure 10:
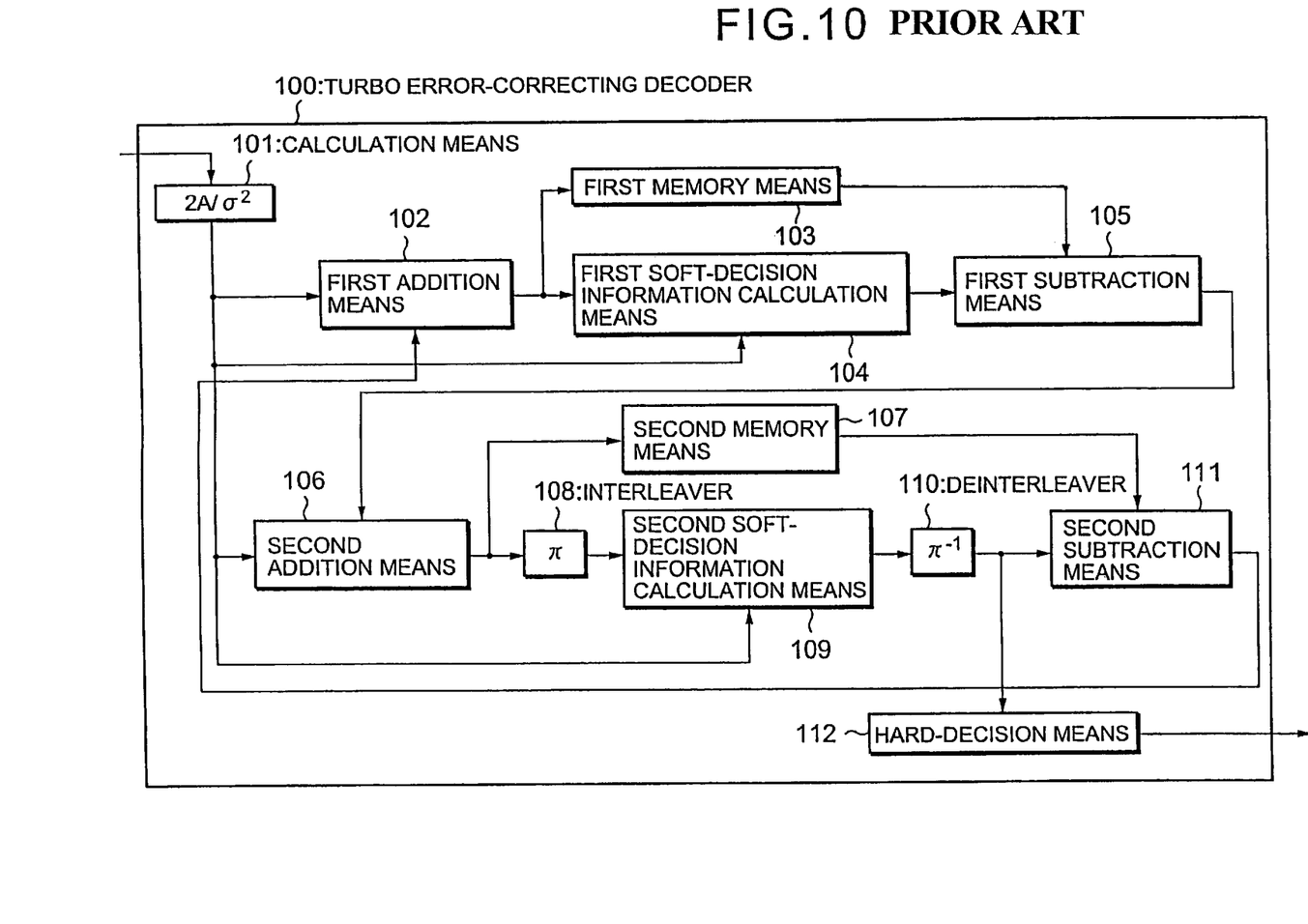
FIG. 10 is a block diagram showing a conventional turbo error-correcting decoder.

FIG. 10 is a block diagram showing the configuration of a conventional turbo error-correcting decoder disclosed in "Soft-Output Decoding Algorithms in Interactive Decoding of Turbo Codes (D. Divsalar and F. Pollara, Feb. 15, 1996) on page 63–87 of TDA Progress Report.

In FIG. 10, designated 100 is a turbo error-correcting decoder. Denoted 101 is a calculation means which calculates an average value and a variance value of reliability information on received bits (absolute value of soft-decision information) and which, based on these values, determines a value by which to convert the soft-decision information and multiplies each soft-decision information with the value. Reference number 102 represents a first addition means which adds up the output result of the calculation means 101 and the previous soft-decision output result. Reference number 103 denotes a first memory means which stores the result of the first addition means 102. Denoted 104 is a first soft-decision information calculation means which calculates the soft-decision information from the output of the calculation means 101 and the output of the first addition means 102. Denoted 105 is a first subtraction means which calculates a soft-decision output result, a difference between the result of the first addition means 102 stored in the first memory means 103 and the soft-decision information calculated by the first soft-decision information calculation means 104.

Designated 106 is a second addition means for adding up the output result of the calculation means 101 and the output result of the first subtraction means 105. Denoted 107 is a second memory means to store the result of the second addition means 106. Denoted 108 is an interleaver to rearrange the order of data. Designated 109 is a second soft-decision information calculation means which calculates the soft-decision information from the output of the interleaver 108 and the output of the calculation means 101. Reference number 110 denotes a deinterleaver which reinstates the order of data rearranged by the interleaver 108. Reference number 111 denotes a second subtraction means which calculates a soft-decision output result, a difference between the result of the second addition means 106 stored in the second memory means 107 and the soft-decision information calculated by the second soft-decision information calculation means 109. Designated 112 is a hard-decision generation means to generate hard-decision information.

Next, the configuration of a general turbo code encoder will be explained.

Figure 11:
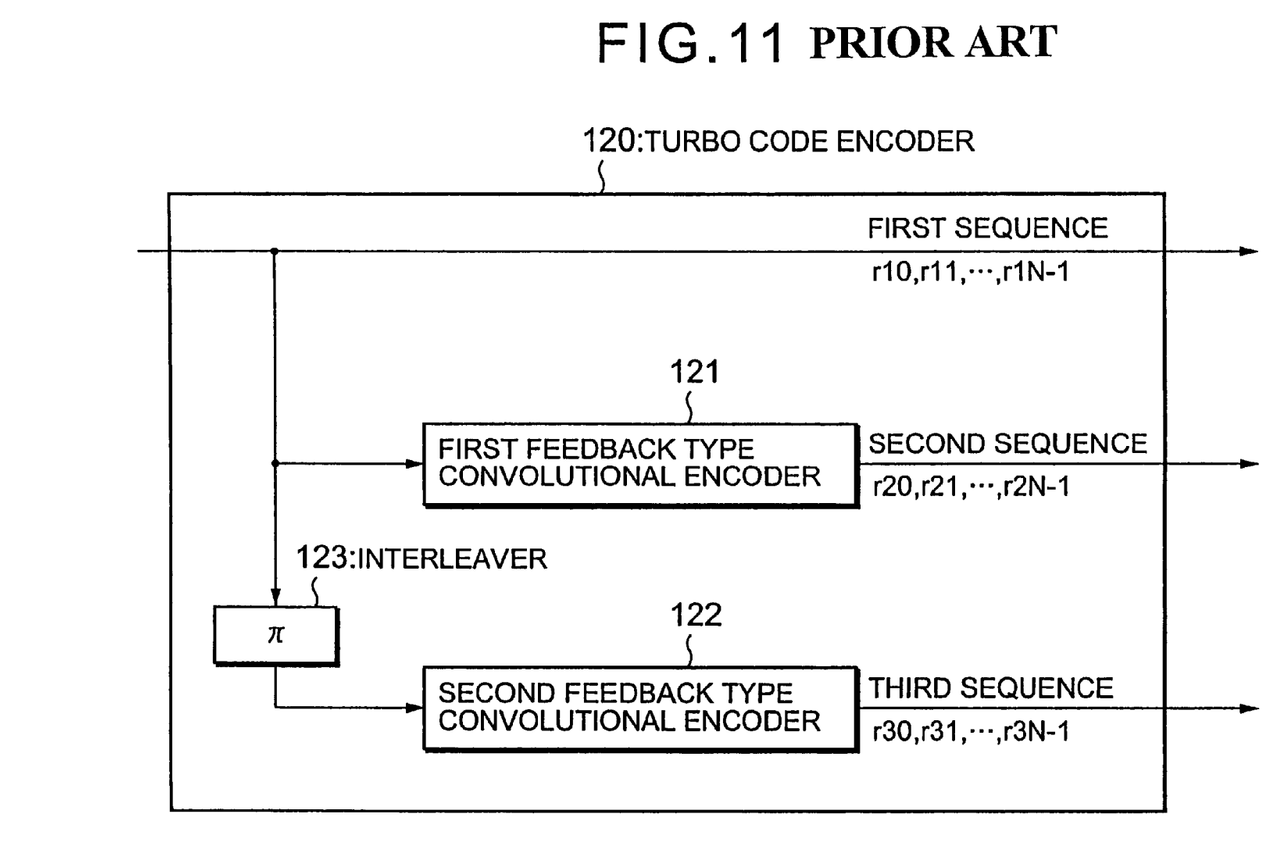
FIG. 11 is a block diagram showing a conventional turbo code encoder.

FIG. 11 is a block diagram showing a conventional turbo code encoder. This diagram defines a first sequence, a second sequence and a third sequence.

In FIG. 11, denoted 120 is a turbo code encoder. 121 and 122 represent a first feedback type convolutional encoder and a second feedback type convolutional encoder, respectively, for generating code sequences. 123 represents an interleaver. In the following explanation, a data bit sequence output as is and its reception sequence are called a first sequence; a sequence generated by the first feedback type convolutional encoder 121 and its reception sequence are called a second sequence; and a sequence generated by the second feedback type convolutional encoder 122 and the interleaver 123 and its reception sequence are called a third sequence.

Next, the operation of the turbo error-correcting decoder 100 when it receives transmission bits encoded by the turbo code encoder 120 will be explained by referring to FIG. 10.

First, the turbo code encoder 120 sends transmission sequence bits of the first, second and third sequences through communication channel or radio, and they are received by the turbo error-correcting decoder 100.

In the decoder 100, upon receiving the reception bits of the first, second and third sequences, the calculation means 101 calculates an average value A and a variance value $\sigma^2$ of the reliability information on the received bits. Based on these values, it calculates $2A/\sigma^2$ and multiplies each of the input soft-decision information by the calculated value of $2A/\sigma^2$.

Next, the multiplied result of the calculation means 101 is sent to the first addition means 102 which adds up the soft-decision output results of second subtraction means 111 and the first sequence among the soft-decision information calculated by the calculation means 101. At the first decoding, the soft-decision output result produced by the second subtraction means 111 is 0, so the first addition means 102 outputs the result of the calculation means 101 as is.

The added result of the first addition means 102 is sent to the first memory means 103 where it is stored. The added result is also entered into the first soft-decision information calculation means 104, which calculates and outputs the soft-decision information of the decoded first sequence on the basis of the reliability information on the second sequence corrected by the calculation means 101 by using a soft-decision decoding algorithm such as MAP decoding or log-MAP decoding.

Next, the first subtraction means 105 subtracts the value stored in the first memory means.103 from the soft-decision information provided by the first soft-decision information calculation means 104 and outputs the calculated difference as the soft-decision output result.

Next, the calculated result from the calculation means 101 is sent to the second addition means 106, which adds up the soft-decision information of the first sequence calculated by the calculation means 101 and the soft-decision output result produced by the first subtraction means 105.

The added result of the second addition means 106 is supplied to the second memory means 107 where it is stored. The added result of the second addition means 106 is also supplied to the interleaver 108 where the order of the calculated result is changed. Then, the output of the interleaver 108 is entered into the second soft-decision information calculation means 109, which calculates and outputs the soft-decision information of the decoded first sequence on the basis of the soft-decision information of the third sequence corrected by the calculation means 101 by using the soft-decision decoding algorithm such as MAP decoding or log-MAP decoding.

Next, the deinterleaver 110 restores the original order of the data. Then, the second subtraction means 111 subtracts the value stored in the second memory means 107 from the soft-decision information output from and deinterleaved by the deinterleaver 110 to calculate a difference or soft-decision output result.

When the above process has been repeated a predetermined number of times, the hard-decision means 112 makes a hard-decision on whether the value output from the deinterleaver 110 is 0 or 1, and outputs the decision as a decoding result. The counting of the number of repetitions and the control for inputting the value into the hard-decision means 112 are performed by a control means (not shown).

In the conventional turbo error-correcting decoder, because the decoding performance is raised for any receiving state, the soft-decision information needs to be corrected by using the average value and the variance value of after-reception reliability. This, however, requires calculating the average and variance values of reliability. This calculation is very complicated and poses problems of slowing down the processing speed and making circuits complex.

SUMMARY OF THE INVENTION

It is an object of the present invention is to provide a turbo error-correcting decoding method capable of increasing the processing speed by correcting the soft-decision information on each received bit with a reduced amount of calculation steps and also a turbo error-correcting decoder with a reduced circuit-size.

In accordance with one aspect of the present invention, there is provided a turbo error-correcting decoder having an average value calculation means to calculate an average value of reliability and a decoding soft-decision information calculation means to determine the soft-decision information whose reliability was corrected from a ratio between the soft-decision information of the received bits and the average value.

In accordance with another aspect of the present invention, there is.provided a turbo error-correcting decoder having an average value calculation means to calculate an average value of reliability, a bit shift amount calculation means to determine a bit shift from the average value, and a bit shift calculation means to determine the soft-decision information with corrected reliability by bit-shifting the reliability information of the received bits by the bit shift amount.

In accordance with another aspect of the present invention, there is provided a turbo code error-correcting decoding method having a step of calculating an average value of reliability, and a step of determining a ratio between the soft-decision information of received bits and the average value and converting the ratio by using a prestored conversion table to obtain the soft-decision information with corrected reliability.

In accordance with another aspect of the present invention, there is provided a turbo error-correcting decoding method having a step of calculating an average value of reliability, and a step of determining a ratio between the soft-decision information of received bits and the average value and multiplying the ratio with a prestored constant to obtain the soft-decision information with corrected reliability.

In accordance with another aspect of the present invention, there is provided a turbo error-correcting decoding method having a step of calculating an average value of reliability and a step of determining a bit shift amount from the average value and bit-shifting the reliability information of received bits by the bit shift amount to obtain the soft-decision information with corrected reliability.

BRIEF DESCRIPTION OF THE DRAWINGS

Preferred embodiments of the present invention will be described in detail with reference to the following figures, wherein.

DESCRIPTION OF THE PREFERRED EMBODIMENTS

Embodiment 1

Figure 1:
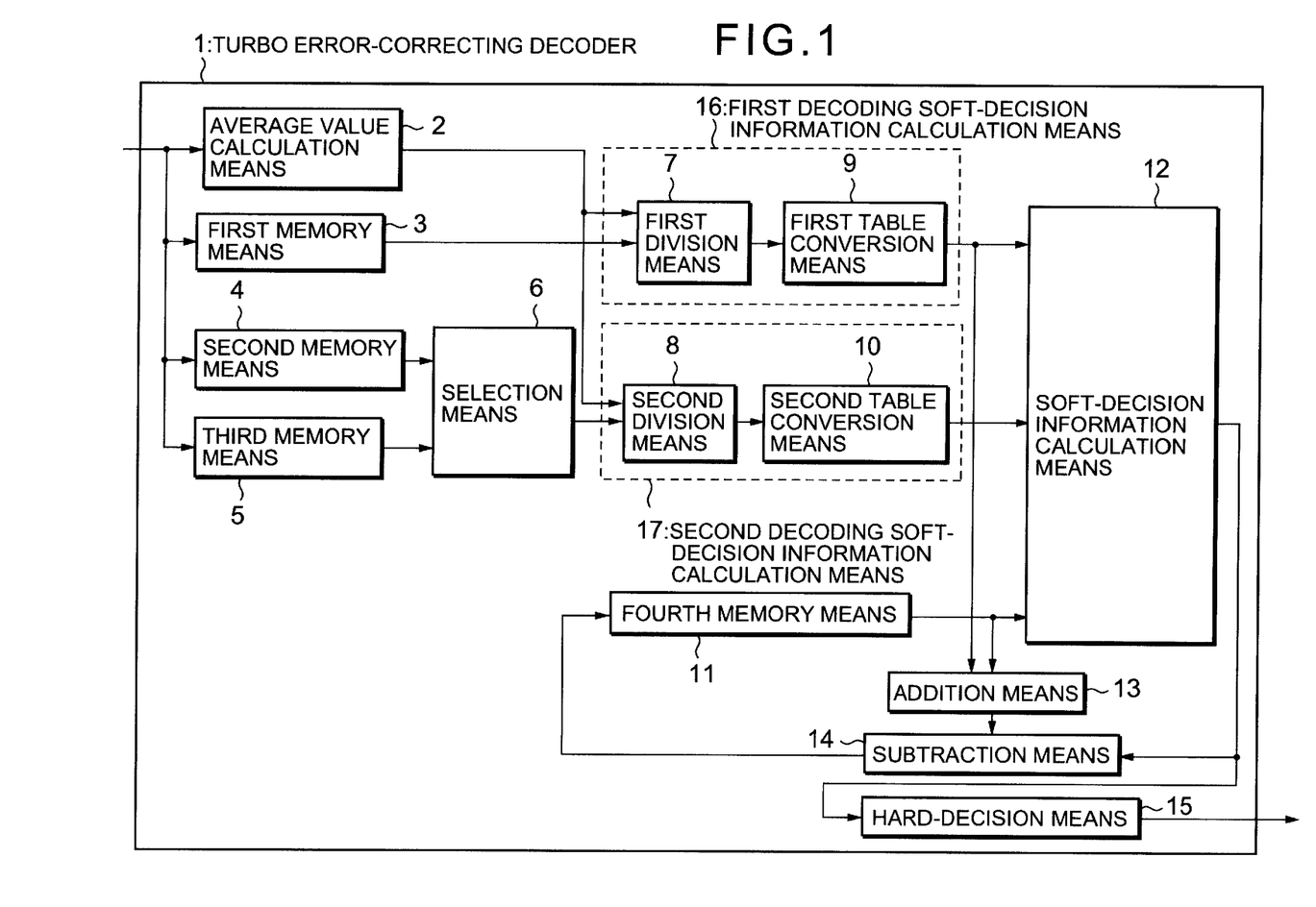
FIG. 1 is a block diagram showing a turbo error-correcting decoder according to Embodiment 1 of the present invention.

FIG. 1 is a block diagram showing the configuration of the turbo error-correcting decoder according to the Embodiment 1 of the present invention.

In FIG. 1, designated 1 is a turbo error-correcting decoder. Denoted 2 is an average value calculation means to calculate an average value of reliability of particular received bits (absolute value of soft-decision information) Reference number 3 represents a first memory means to store the first sequence. 4 represents a second memory means to store the second sequence. 5 represents a third memory means to store the third sequence. 6 represents a selection means to select a sequence stored either in the second memory means 4 or the third memory means 5 as bits to be inspected for calculating the soft-decision information. 7 represents a first division means to divide the soft-decision information value of the first sequence stored in the first memory means 3 by the average value calculated by the average value calculation means 2.

Reference number 8 denotes a second division means to divide the soft-decision information of each sequence stored in the second memory means 4 or third memory means 5 by the average value calculated by the average value calculation means 2. 9 denotes a first table conversion means to convert the value calculated by the first division means 7 into the soft-decision information for use in decoding. 10 denotes a second table conversion means to convert the value calculated by the second division means 8 into the soft-decision information for use in decoding. The first table conversion means 9 and the second table conversion means 10 each have a conversion table whose address is the soft-decision information of received bit divided by the average value of reliability. With this conversion table these table conversion means perform conversion to obtain the reliability-corrected soft-decision information for use in decoding.

Denoted 11 is a fourth memory means to store a value of difference between the soft-decision output result in the previous cycle of the first sequence and the soft-decision information of input. Denoted 12 is a soft-decision information calculation means 12 to calculate the soft-decision information of the decoded first sequence. 13 represents an addition means to add up the soft-decision information of each bit of the first sequence entered into the soft-decision information calculation means 12. 14 represents a subtraction means to calculate a difference between the output of the soft-decision information calculation means 12 and the output of the addition means 13. 15 represents a hard-decision means to calculate a hard-decision output result from the output of the soft-decision information calculation means 12. The first division means 7 and the first table conversion means 9 constitute a first decoding soft-decision information calculation means 16, and the second division means 8 and the second table conversion means 10 constitute a second decoding soft-decision information calculation means 17.

Next, the operation from the reception of the transmission bits from the turbo code encoder to the outputting of the hard-decision information will be explained by referring to FIG. 1 and the flow chart of FIG. 2 that shows the turbo error-correcting decoding method.

First, upon detecting that the transmission bits have been sent via communication channel, the decoder initializes the counter (not shown) that indicates the number of internal repetitive decoding operations performed (step 1 or S1). The soft-decision information of received bits is entered as $x1i$, $x2i$, $x3i$ ($i=0, 1, \ldots, N-1$) for the first, second and third sequences and stored in the first memory means 3, second memory means 4 and third memory means 5. The average value calculation means 2 calculates an average value A of reliability of predetermined received bits. For example, the average value A is an average value of absolute values of soft-decision information (S2).

Next, it is checked whether the counter representing the number of repetitive decoding operations performed has reached a predetermined value K (S3). If S3 has found that K is not reached, the average value calculation means 2 sends the average value A to the first division means 7 and the second division means 8. Further, the first memory means 3 sends the soft-decision information of the first sequence to the first division means 7. The selection means 6 sets a path between the second memory means 4 and the second division means 8 to send the soft-decision information of the second sequence from the second memory means 4 to the second division means 8.

The first division means 7 calculates the ratio between each soft-decision information of the first sequence and the average value A according to the following formula (1).

$$Bji = Xji/A \quad (j=1, 2, 3) \qquad (1)$$

(Here, j=1).

The ratio $B1i$ is sent to the first table conversion means 9 where it is converted by the conversion table stored therein into $y1i = \sigma(B1i)$ to correct the reliability of the soft-decision information.

The similar operation is also performed for the soft-decision information of the second sequence. The second division means 8 calculates the ratio $B2i$ which is then converted by the second table conversion means 10 into $y2i$ (S4).

Next, the first sequence $y1i$ with the reliability corrected is output from the first table conversion means 9 to the soft-decision information calculation means 12; the second sequence $y2i$ with the reliability corrected is output from the second table conversion means 10 to the soft-decision information calculation means 12; and the soft-decision output result $qi$ of previous cycle is output from the fourth memory means 11 to the soft-decision information calculation means 12. The soft-decision information calculation means 12 calculates the soft-decision information $z1i$ of the first sequence by the soft-decision decoding algorithm such as MAP decoding and log-MAP decoding (S5). The fourth memory means 11 stores 0 when the first soft-decision information is generated.

Next, the addition means 13 adds the corrected soft-decision information $y1i$ of the first sequence sent from the first table conversion means 9 and the soft-decision output result $qi$ of the first sequence sent from the fourth memory means 11. The subtraction means 14 subtracts the value supplied from the addition means 13 from the soft-decision information supplied from the soft-decision information calculation means 12 to obtain the soft-decision output result $pi$. The soft-decision output results $pi$ are successively stored in the fourth memory means 11 (S6).

Next, the average value calculation means 2 supplies the average value A to the second division means 8. When the selection means 6 establishes the path between the third memory means 5 and the second division means 8, the soft-decision information of the third sequence is sent from the third memory means 5 to the second division means 8. The second division means 8, as in S4, calculates the ratio $B3i$, which is converted by the second table conversion means 10 into $y3i = \sigma(B3i)$, thereby correcting the reliability (S7).

Next, the reliability-corrected third sequence $y3i$ is output from the second table conversion means 10 to the soft-decision information calculation means 12; the previous cycle soft-decision output result $\pi(pi)$ is output from the fourth memory means 11 to the soft-decision information calculation means 12; and the corrected first sequence $\pi(y1i)$ is output from the first table conversion means 9 to the soft-decision information calculation means 12. The soft-decision information calculation means 12 processes these data by the soft-decision decoding algorithm such as MAP decoding and log-MAP decoding to generate the soft-decision information of the first sequence $\pi(z2i)$ (S8).

Next, the addition means 13 calculates the sum of the reliability-corrected first sequence $\pi(y1i)$ sent from the first table conversion means 9 and the soft-decision information $\pi(pi)$ of the first sequence sent from the fourth memory means 11. The subtraction means 14 subtracts the sum supplied from the addition means 13 from the soft-decision information π(z2i) sent from the soft-decision information calculation means 12 to obtain the soft-decision output result π(qi). The soft-decision output result is stored in the fourth memory means 11 in the interleaved order (S9). That is, qi is stored.

Then, the counter indicating the number of repetitive decoding operations performed is incremented (S10) and the operation moves to S3.

The above process is repeated until m equals K.

When, at S3, m becomes K, the hard-decision means 15 calculates the hard-decision information from the soft-decision information π(z2i) generated by the soft-decision information calculation means 12, checks whether it is 0 or 1, arranges the check results in the forward order, and outputs z2i as final decoded results (S11). This process corresponds to rearranging the data order as specified by the deinterleaver $\pi^{-1}$ and outputting the deinterleaved data.

Because this method calculates an average of reliability of particular received bits and corrects the reliability of the received bits by using the average value and the conversion table, it is possible to eliminate the need for complicated calculation and thereby improve the processing speed.

Further, because there is no need to perform complex calculations, the circuit configuration can be simplified and size reduced.

In the Embodiment 1, the two conversion processes are carried out in different steps: one process to determine the reliability-corrected soft-decision information for decoding from the soft-decision information of the first and second sequences by using the conversion table; and one process to determine the reliability-corrected soft-decision information for decoding from the soft-decision information of the third sequence by using the conversion table. These processes may be performed at one time. That is, the soft-decision information of the first, second and third sequences may be converted by the conversion table into soft-decision information for decoding and the converted soft-decision information be stored in buffers for subsequent processing.

Figure 2:
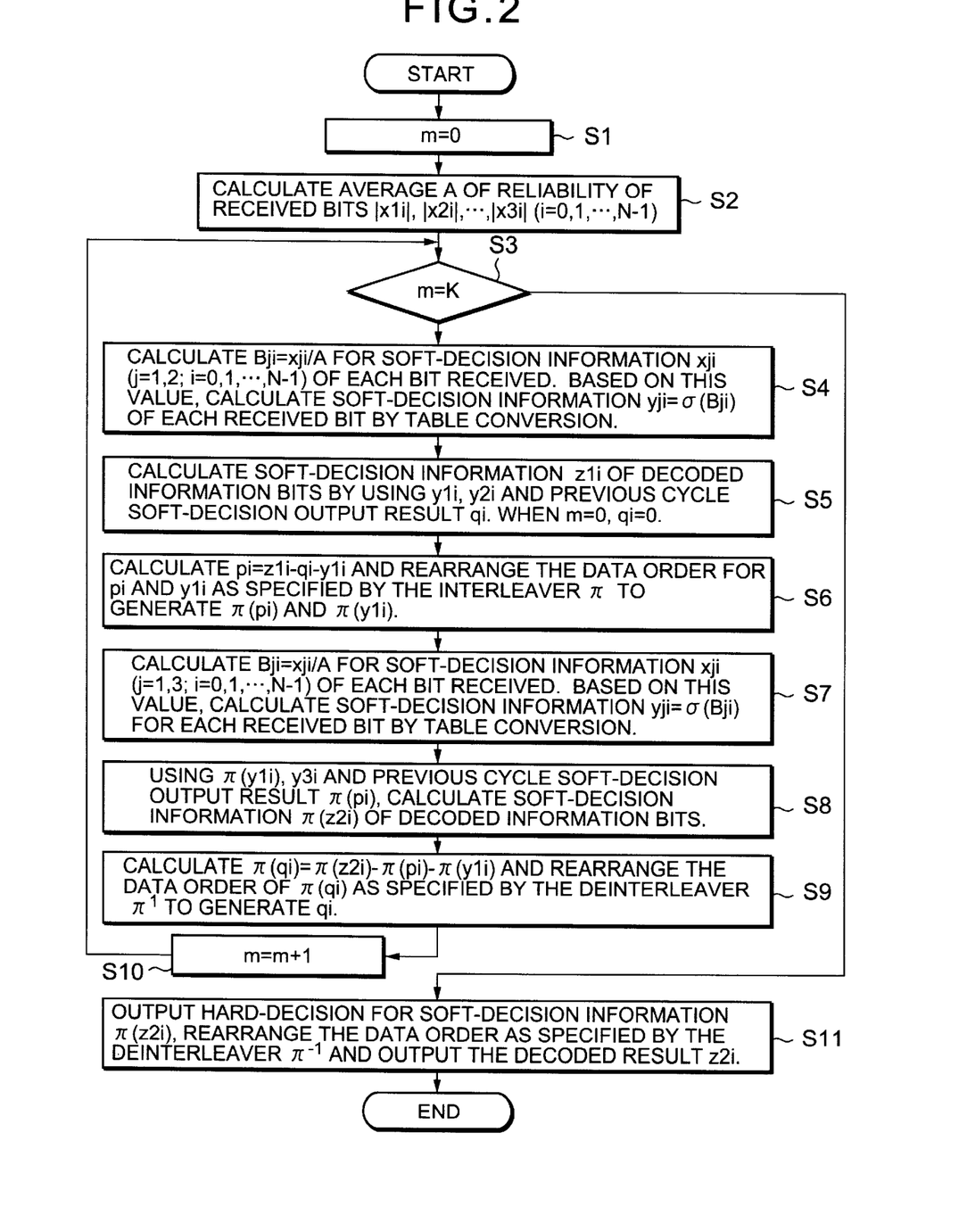
FIG. 2 is a flow chart showing a turbo error-correcting decoding method according to Embodiment 1 of the invention.
Figure 3:
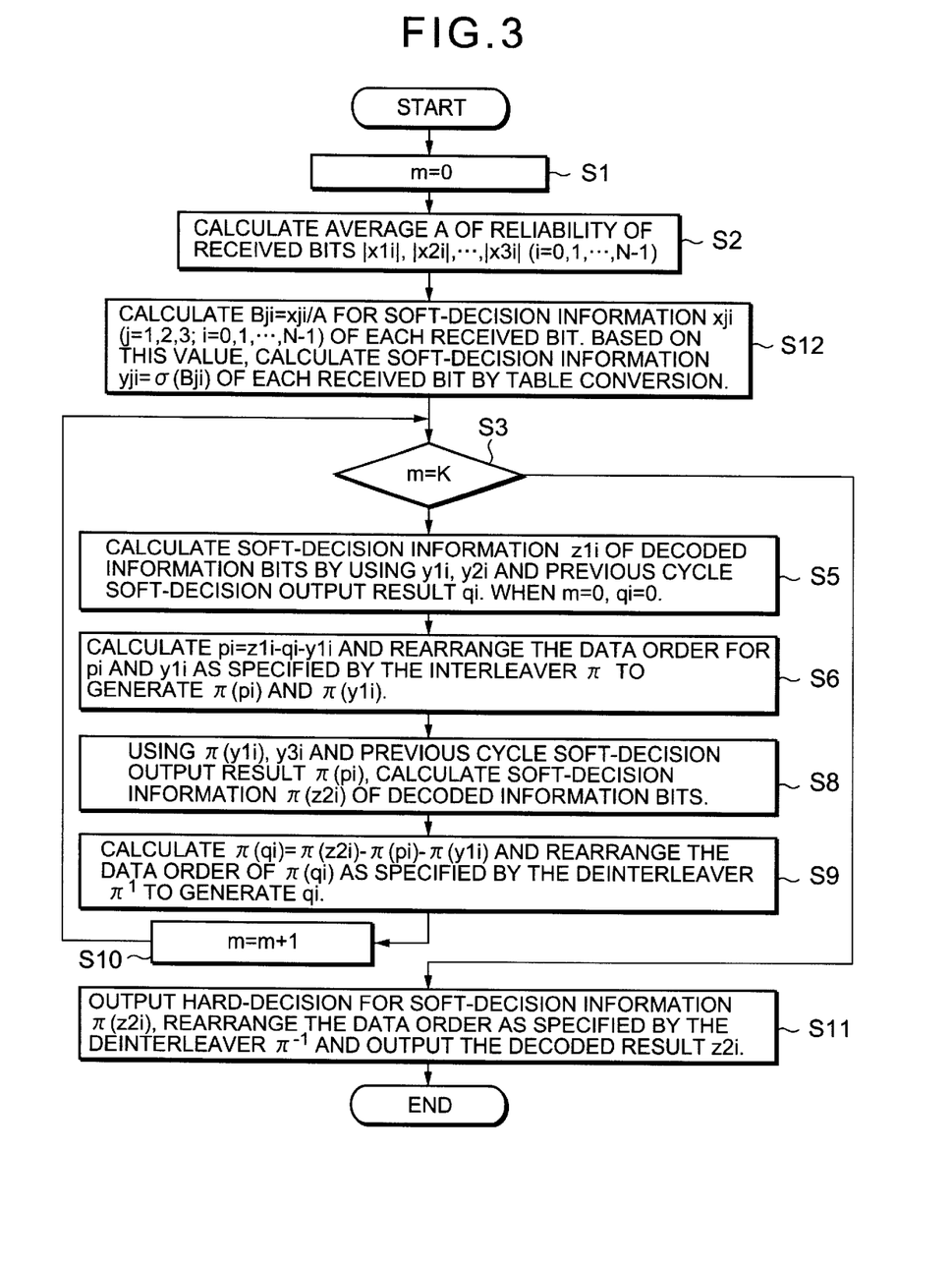
FIG. 3 is a flow chart showing another turbo error-correcting decoding method according to Embodiment 1 of the invention.

This method is equal to combining S4 and S7 in the flow chart of FIG. 2 into one step and inserting this step between S2 and S3, and is represented by the flow chart of FIG. 3. In FIG. 3, S12 executes processing corresponding to S4 and S7.

Therefore, the calculation of soft-decision information for decoding needs only to be performed once, further increasing the processing speed.

Embodiment 2

Figure 4:
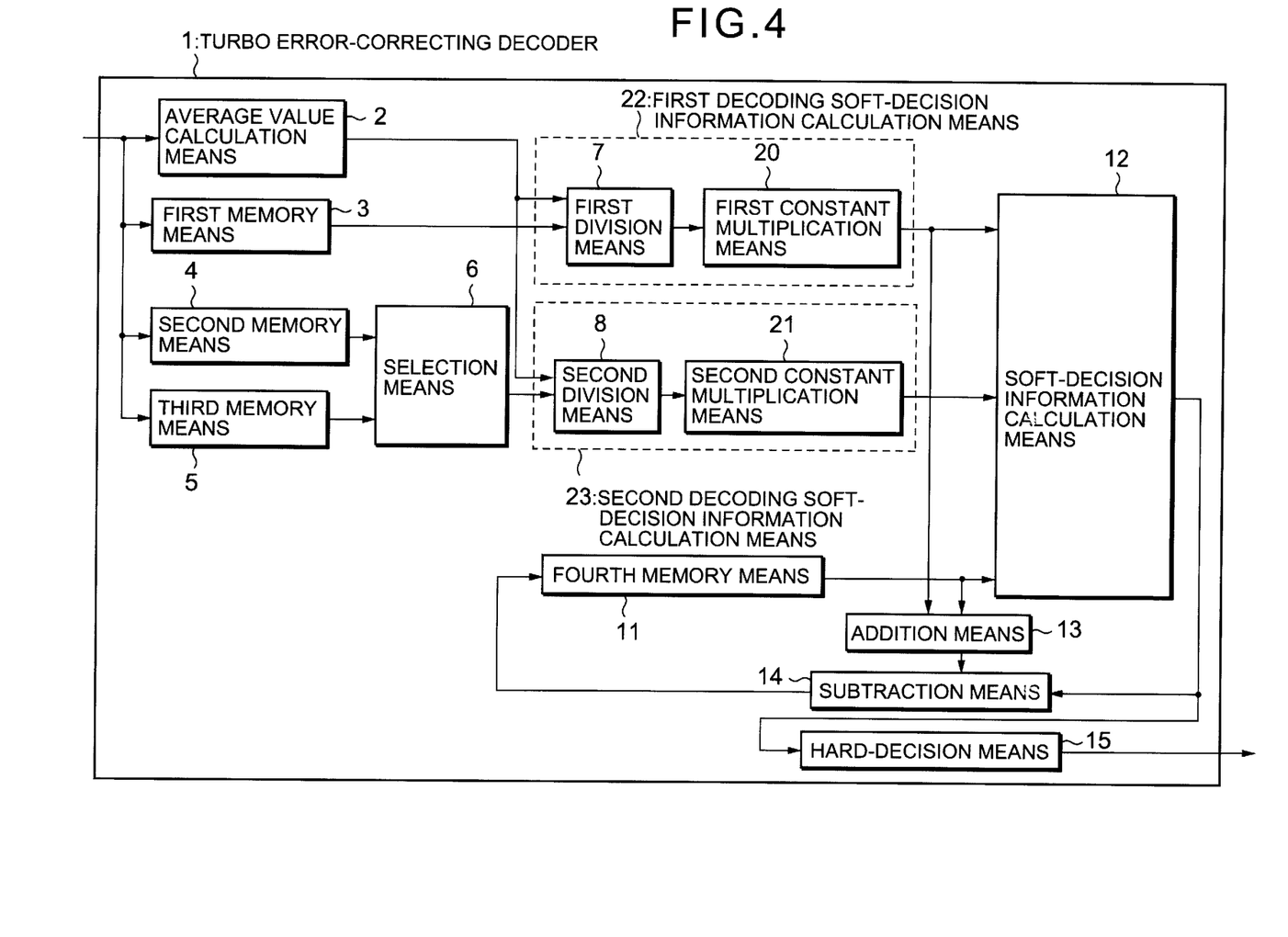
FIG. 4 is a block diagram showing a turbo error-correcting decoder according to Embodiment 2 of the present invention.

FIG. 4 is a block diagram showing the configuration of the turbo error-correcting decoder according to the Embodiment 2 of the invention. This decoder differs from the decoder of FIG. 1 in that, when the values calculated by the first division means and the second division means are converted into reliability-corrected soft-decision information for decoding, this decoder multiplies these calculated values with a predetermined constant.

In FIG. 4, reference number 20 denotes a first constant multiplication means to calculate the reliability-corrected soft-decision information for decoding by multiplying the value calculated by the first division means 7 with a predetermined constant. Reference number 21 represents a second constant multiplication means to calculate the reliability-corrected soft-decision information for decoding by multiplying the value calculated by the second division means 8 with a predetermined constant to. The first division means 7 and the first constant multiplication means 20 constitute a first decoding soft-decision information calculation means 22. The second division means 8 and the second constant multiplication means 21 constitute a second decoding soft-decision information calculation means 23.

Next, the operation from receiving the transmission bits from the turbo code encoder to outputting the hard-decision information will be explained by referring to FIG. 4 and the flow chart of FIG. 5 that shows the turbo error-correcting decoding method.

First, S1, S2 and S3 are executed.

When, at S3, m is not equal to K, the average value calculation means 2 sends the average value A to the first division means 7 and the second division means 8. The first memory means 3 sends the soft-decision information of the first sequence to the first division means 7, and the selection means 6 establishes the path between the second memory means 4 and the second division means 8 to cause the soft-decision information of the second sequence to be sent from the second memory means 4 to the second division means 8.

The first division means 7 calculates the ratio B1i between the soft-decision information of the first sequence and the average value A according to the equation 1.

The ratio B1i is sent to the first constant multiplication means 20 which performs the following calculation (here j=1) to correct the reliability of the soft-decision information.

$$yji = M \cdot Bji (= M \cdot xji/A)(j=1, 2, 3) \qquad (2)$$

where M is a predetermined multiplier which preferably ranges between about 0.2 and 0.4.

The similar operation is also performed on the soft-decision information of the second sequence. The second division means 8 calculates B2i and the second constant multiplication means 21 calculates y2i (S20)

Next, S5 and S6 are executed.

Next, the average value calculation means 2 supplies the average value A to the second division means 8. The selection means 6 sets the path between the third memory means 5 and the second division means 8 to cause the soft-decision information of the third sequence to be sent from the third memory means 5 to the second division means 8. The second division means 8 calculates B3i in the same way as S20 and the second constant multiplication means 21 determines y3i=M·B3i thus correcting the reliability (S21).

Next, S8, S9, S10 are executed.

When, at S3, m equals K, S11 is executed.

Figure 5:
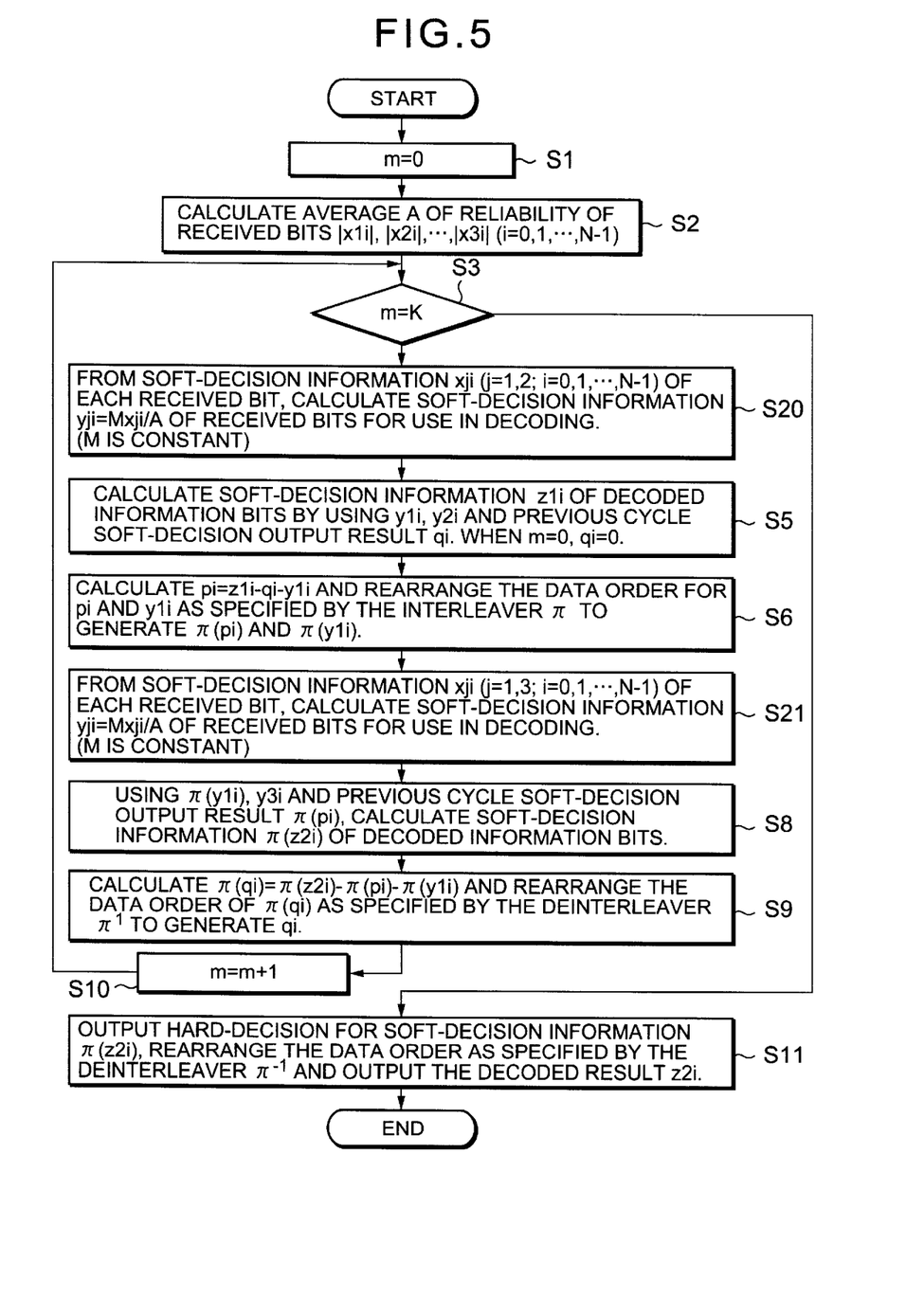
FIG. 5 is a flow chart showing a turbo error-correcting decoding method according to Embodiment 2 of the invention.

The operations of S1, S2, S3, S5, S6, S8, S9, S10 and S11 in the flow chart of FIG. 5 are the same as those in the flow chart of FIG. 2.

Because this method calculates an average of reliability of particular received bits and multiplies the average value with a multiplier M to produce the soft-decision information corrected for each received bit, the processing speed can be improved, compared with the one achieved by the method that performs the table conversion.

Further, because there is no need for the decoder to have the conversion table, the circuit size can be further reduced.

In the Embodiment 2, the two calculation processes are carried out in different steps: one process to calculate the soft-decision information for decoding from the soft-decision information of the first and second sequences; and one process to calculate the soft-decision information for decoding from the soft-decision information of the third sequence. These processes may be performed at one time. That is, the soft-decision information of the first, second and third sequences may be processed to calculate the soft-decision information for decoding and the calculated soft-decision information be stored in buffers for subsequent processing.

Figure 6:
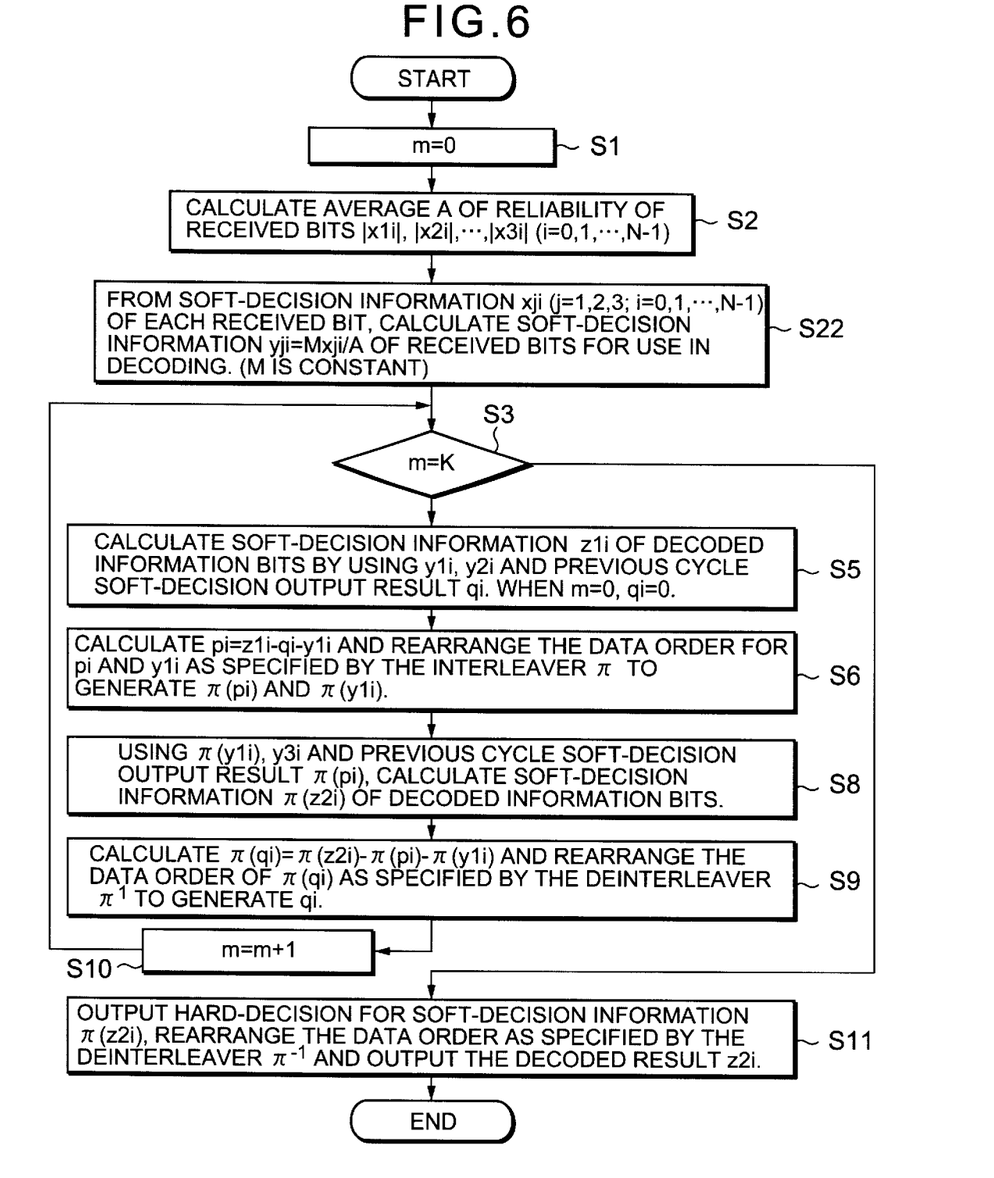
FIG. 6 is a flow chart showing another turbo error-correcting-decoding method according to Embodiment 2 of the invention.

This method is equal to combining S20 and S21 in the flow chart of FIG. 5 into one step and inserting this step between S2 and S3, and is represented by the flow chart of FIG. 6. In FIG. 6, S22 executes processing corresponding to S20 and S21.

Therefore, the calculation of soft-decision information for decoding needs only to be performed once, further increasing the processing speed.

Embodiment 3

Figure 7:
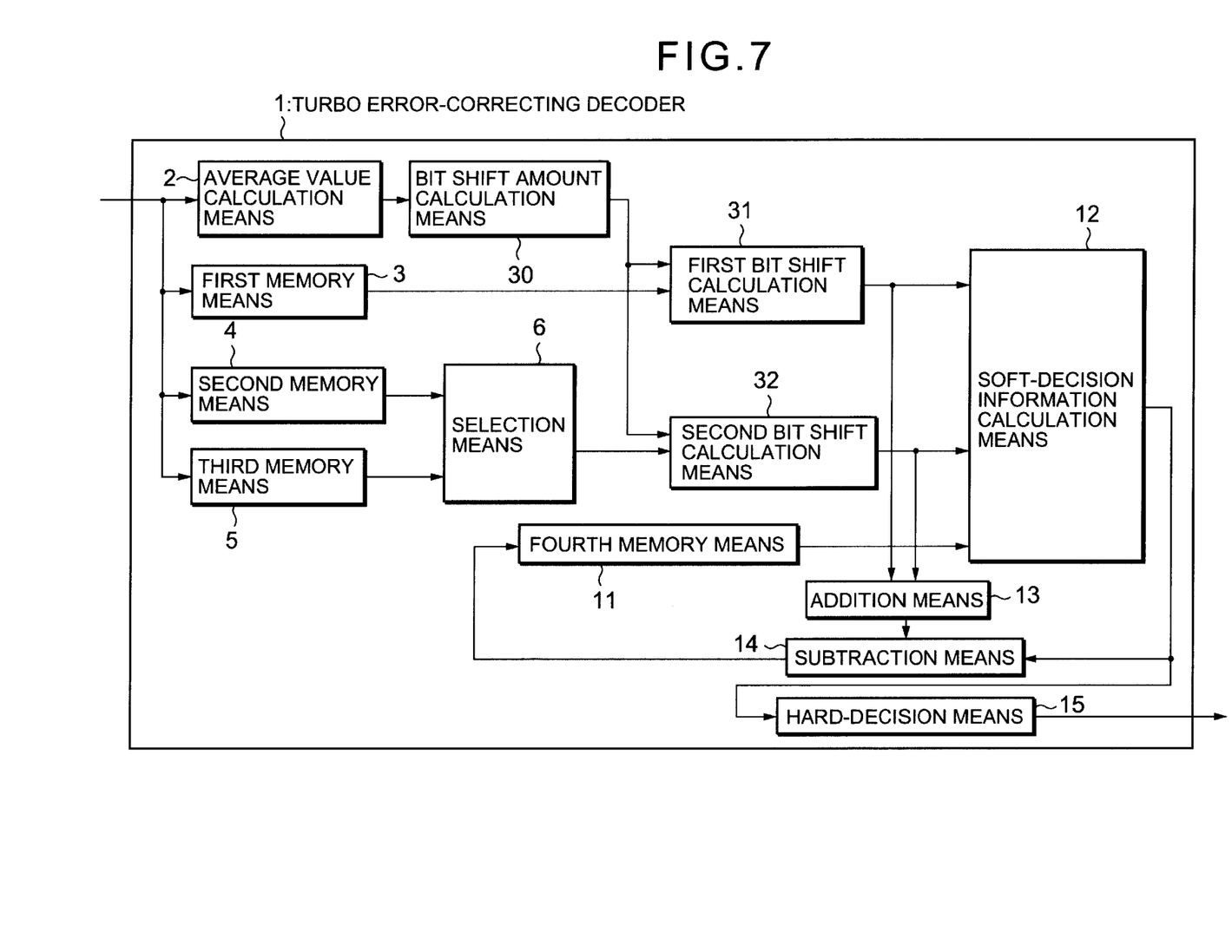
FIG. 7 is a block diagram showing a turbo error-correcting decoder according to Embodiment 3 of the present invention.

FIG. 7 is a block diagram showing the configuration of the turbo error-correcting decoder according to the Embodiment 3 of the invention. This decoder differs from the decoder of FIG. 1 in that the soft-decision information stored in the first memory means 3, the second memory means 4 and the third memory means 5 is bit-shifted by using the average value provided by the average value calculation means 2 to obtain the reliability-corrected soft-decision information for decoding.

In FIG. 7, denoted 30 is a bit shift amount calculation means 30 to calculate the bit shift amount of the reliability information of received bits according to the average value calculated by the average value calculation means 2. Denoted 31 is a first bit shift calculation means to bit-shift the reliability information of the first sequence. Designated 32 is a second bit shift calculation means to bit-shift the reliability information of the second or third sequence.

Next, the operation from receiving the transmission bits from the turbo code encoder to outputting the hard-decision information will be explained by referring to FIG. 7 and a flow chart of FIG. 8 that shows the turbo error-correcting decoding method.

First, S1, S2 and S3 are executed.

When, at S3, m is not equal to K, the average value calculation means 2 sends the average value A to the bit shift amount calculation means 30. The bit shift amount calculation means 30 calculates an appropriate bit shift amount from this average value. The appropriate bit shift amount is one that brings the average value closest to a predetermined value and this eliminates variations of the reliability average. The bit shift amount is supplied from the bit shift amount calculation means 30 to the first bit shift calculation means 31. The first bit shift calculation means 31 is also supplied with the soft-decision information of the first sequence from the first memory means 3. The first bit shift calculation means 31 bit-shifts the reliability information of the first sequence by the bit shift amount to obtain the reliability-corrected soft-decision information y1i for decoding.

The operation similar to that performed by the first bit shift calculation means 31 is also carried out for the second sequence. The second bit shift calculation means 32 bit-shifts the soft-decision information of the second sequence to determine the soft-decision information y2i for decoding (S30).

Next, S5 and S6 are executed.

Based on the average value A sent from the average value calculation means 2, the bit shift amount calculation means 30 calculates the bit shift amount, which is then supplied to the second bit shift calculation means 32. The selection means 6 sets the path between the third memory means 5 and the second bit shift calculation means 32 to cause the soft-decision information of the third sequence to be sent from the third memory means 5 to the second bit shift calculation means 32. The second bit shift calculation means 32 performs bit-shifting as in S30 to determine the soft-decision information y3i for decoding (S31).

Next, S8, S9 and S10 are executed.

When, at S3, m equals K, S11 is executed.

Figure 8:
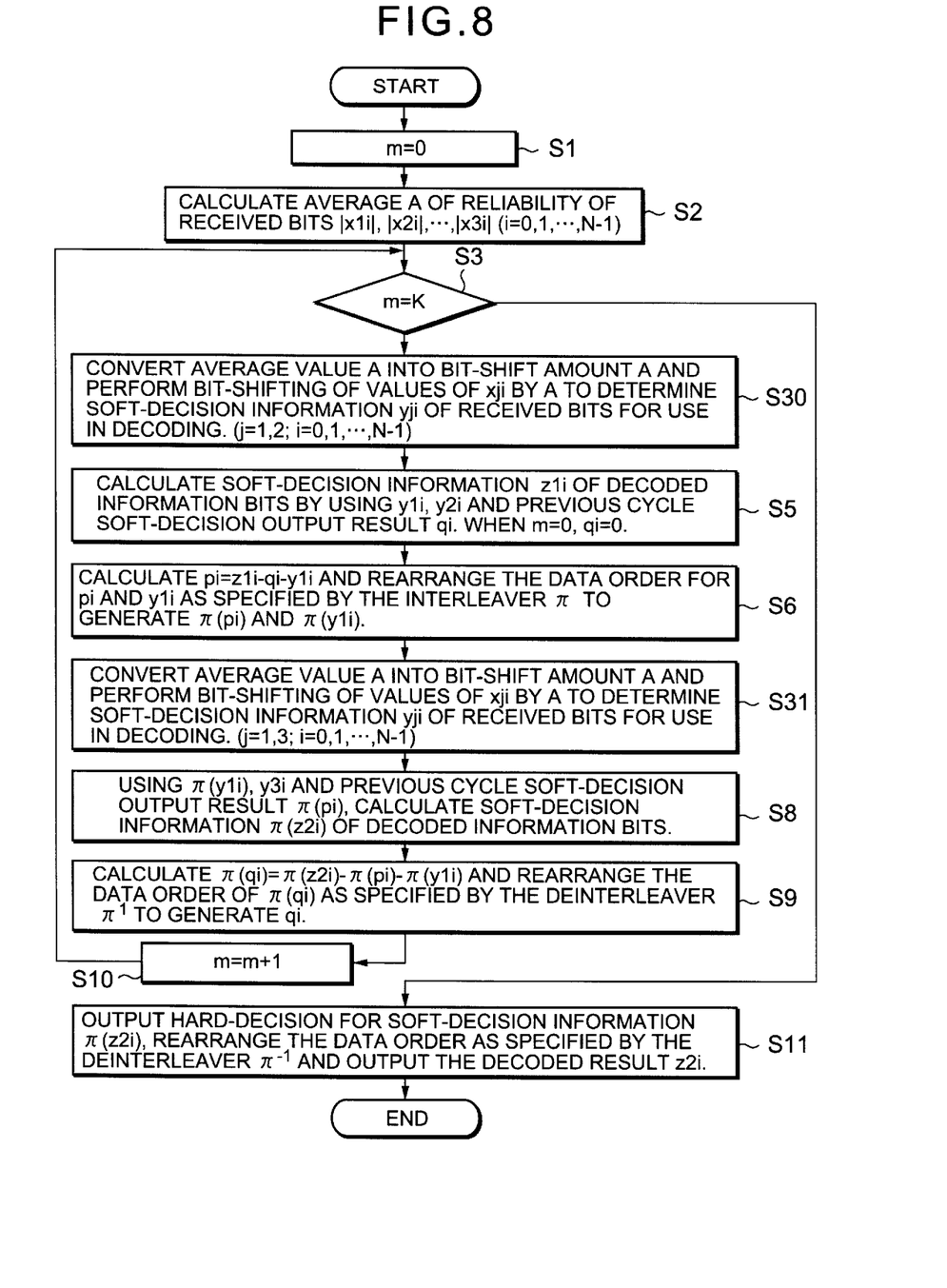
FIG. 8 is a flow chart showing a turbo error-correcting decoding method according to Embodiment 3 of the invention.

The operations of S1, S2, S3, S5, S6, S8, S9, S10 and S11 in the flow chart of FIG. 8 are similar to those in the flow chart of FIG. 2.

Because this method can determine the soft-decision information for decoding only by the simple bit-shifting without performing multiplication, the processing speed can be improved further.

Further, because this decoder can use a bit-shift circuit rather than the calculation circuit to determine the soft-decision information for decoding, the circuit size can be further reduced.

In the Embodiment 3, the two calculation processes are carried out in different steps: one process to calculate the soft-decision information for decoding by bit-shifting the soft-decision information of the first and second sequences; and one process to calculate the soft-decision information for decoding by bit-shifting the soft-decision information of the third sequence. These processes may be performed at one time. That is, the soft-decision information of the first, second and third sequences may be bit-shifted to calculate the soft-decision information for decoding and the calculated soft-decision information be stored in buffers for use in subsequent soft-decision information correction processing.

Figure 9:
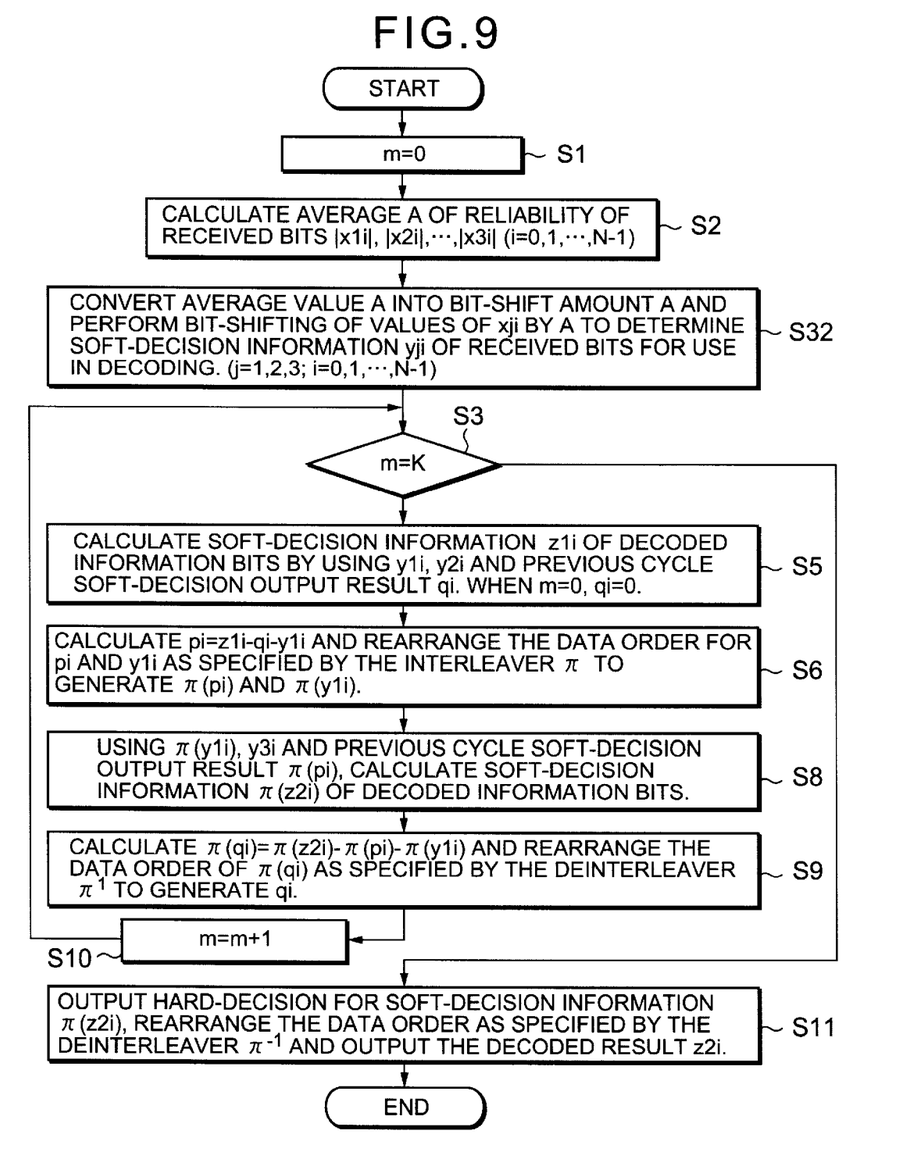
FIG. 9 is a flow chart showing another turbo error-correcting decoding method according to Embodiment 3 of the invention.

This is equal to combining S30 and S31 in the flow chart of FIG. 8 into one step and inserting this step between S2 and S3, and is represented by the flow chart of FIG. 9. In FIG. 9, S32 executes the processing corresponding to S30 and S31.

Therefore, the calculation of the soft-decision information for decoding needs only to be performed once, further increasing the processing speed.

The many features and advantages of the invention are apparent from the detailed specification and thus it is intended by the appended claims to cover all such features and advantages of the invention which fall within the true spirit and scope thereof. Further, since numerous modifications and changes will readily occur to those skilled in the art, it is not desired to limit the invention to the exact construction and operation illustrated and described, and accordingly, all suitable modifications and equivalents may be resorted to, falling with the scope of the invention.

What is claimed is:

1. A turbo error-correcting decoder which receives transmission bits sent from a turbo code encoder, determines soft-decision information whose reliability is corrected based on the received bits, and determines hard-decision information by using the reliability-corrected soft-decision information, the turbo error-correcting decoder comprising:

an average value calculation means to calculate an average value of the reliability; and a decoding soft-decision information calculation means to determine the reliability-corrected soft-decision information from a ratio between the soft-decision information of the received bits and the average value.

2. A turbo error-correcting decoder according to claim 1, wherein the decoding soft-decision information calculation means has a division means to determine the ratio between the soft-decision information of the received bits and the average value, and a table conversion means to convert the ratio determined by the division means into the reliability-corrected soft-decision information by using a prestored conversion table.

3. A turbo error-correcting decoder according to claim 1, wherein decoding soft-decision information calculation means has a division means to determine the ratio between the soft-decision information of the received bits and the average value, and a multiplication means to multiply the ratio determined by the division means with a prestored constant to determine the reliability-corrected soft-decision information.

4. A turbo error-correcting decoder which receives transmission bits sent from a turbo code encoder, determines soft-decision information whose reliability is corrected based on the received bits, and determines hard-decision information by using the reliability-corrected soft-decision information, the turbo error-correcting decoder comprising:

an average value calculation means to calculate an average value of the reliability;

a bit shift amount calculation means to determine a bit shift amount from the average value; and     a bit shift calculation means to bit-shift the reliability information of the received bits by the bit-shift amount to determine the reliability-corrected soft-decision information.

5. A turbo error-correcting decoding method which receives transmission bits sent from a turbo code encoder, determines soft-decision information whose reliability is corrected based on the received bits, and determines hard-decision information by using the reliability-corrected soft-decision information, the turbo error-correcting decoding method comprising the steps of:

calculating an average value of the reliability; and determining a ratio between the soft-decision information of the received bits and the average value and converting the ratio by a prestored conversion table into the reliability-corrected soft-decision information.

6. A turbo error-correcting decoding method which receives transmission bits sent from a turbo code encoder, determines soft-decision information whose reliability is corrected based on the received bits, and determines hard-decision information by using the reliability-corrected soft-decision information, the turbo error-correcting decoding method comprising the steps of:

calculating an average value of the reliability; and determining a ratio between the soft-decision information of the received bits and the average value and multiplying the ratio with a prestored constant to determine the reliability-corrected soft-decision information.

7. A turbo error-correcting decoding method which receives transmission bits sent from a turbo code encoder, determines soft-decision information whose reliability is corrected based on the received bits, and determines hard-decision information by using the reliability-corrected soft-decision information, the turbo error-correcting decoding method comprising the steps of:

calculating an average value of the reliability; and determining a bit shift amount from the average value and bit-shifting the soft-decision information of the received bits by the bit shift amount to determine the reliability-corrected soft-decision information.

8. A machine-readable medium having stored thereon a plurality of executable instructions, the plurality of instructions comprising instructions to:

calculate an average value of reliability for bits received from an encoder;

generate reliability-corrected, soft-decision information for said received bits using a predetermined algorithm including determining a ratio between soft-decision information of the received bits and said average value; and     determine hard-decision information for said received bits using said generated soft-decision information to generate decoded information for said received bits.

9. A machine-readable medium having stored thereon a plurality of executable instructions, the plurality of instructions comprising instructions to:

calculate an average value of reliability for bits received from an encoder;

generate reliability-corrected, soft-decision information for said received bits using a predetermined algorithm including determining a ratio between soft-decision information of the received bits and said average value and multiplying said ratio by a prestored constant; and     determine hard-decision information for said received bits using said generated soft-decision information to generate decoded information for said received bits.

10. A machine-readable medium having stored thereon a plurality of executable instructions, the plurality of instructions comprising instructions to:

calculate an average value of reliability for bits received from an encoder;

generate reliability-corrected, soft-decision information for said received bits using a predetermined algorithm including determining a bit shift amount from said average value for said received bits; and     determining hard-decision information for said received bits using said generated soft-decision information to generate decoded information for said received bits.

\* \* \* \* \*